United States Patent [19]

Losapio et al.

[11] Patent Number: 4,713,609
[45] Date of Patent: Dec. 15, 1987

[54] BATTERY BACKUP INSTALLATION FOR ELECTRIC METER

[75] Inventors: Peter F. Losapio; Warren R. Germer, both of Dover, N.H.; Maurice J. Ouellette, North Berwick, Me.; Ansell W. Palmer, Hampton, N.H.

[73] Assignee: General Electric Company, Somersworth, N.H.

[21] Appl. No.: 772,701

[22] Filed: Sep. 5, 1985

[51] Int. Cl.[4] .............................................. G01R 1/04
[52] U.S. Cl. ..................... 324/156; 324/113; 361/364; 307/66
[58] Field of Search ............... 324/156, 116, 149, 113, 324/111, 112, 157, 103 R, 142; 429/96–100, 1; 339/256 R; 361/364, 372–375; 73/431; 307/48, 66

[56] References Cited

U.S. PATENT DOCUMENTS

| | | | |
|---|---|---|---|
| 3,400,586 | 9/1968 | Wilson | 324/103 R |
| 3,782,814 | 1/1974 | Greenbalt | 429/99 X |
| 4,075,402 | 2/1978 | Okamoto | 429/98 |
| 4,214,172 | 7/1980 | See | 307/66 X |
| 4,281,727 | 8/1981 | Meeks | 429/98 |
| 4,297,635 | 10/1981 | Stevens | 324/156 |
| 4,346,151 | 8/1982 | Uba et al. | 429/99 X |
| 4,368,519 | 1/1983 | Kennedy | 324/113 X |
| 4,429,025 | 1/1984 | Stow | 429/97 |

Primary Examiner—Reinhard J. Eisenzopf
Assistant Examiner—Jack B. Harvey
Attorney, Agent, or Firm—Robert E. Brunson; Thomas R. Morrison

[57] ABSTRACT

A battery backup installation for a time of use register for an electric meter is mounted within a case of the electric meter. The case includes a hatch which permits removal and replacement of the battery without requiring removal of the case from the meter. In one embodiment, the battery is installed in a battery clip on the face plate of the meter where it is accessible through the hatch. An extra length of wires from the battery permits the battery, and its mating connectors, to be withdrawn through the hatch for replacement thereof. In a second embodiment of the invention, the battery is captured in a door of the hatch and is withdrawn from the meter by the action of opening the hatch. In this embodiment, the hatch may be hinged or not hinged. Battery replacement is facilitated while the electronic register module is separated from line-supplied power. An auxiliary battery provides an auxiliary source of backup power during batterychange.

8 Claims, 6 Drawing Figures

BATTERY BACKUP INSTALLATION FOR ELECTRIC METER

BACKGROUND OF THE INVENTION

The present invention relates to electric meters containing electronic registers and, more particularly, to apparatus for providing battery backup to an internal clock in an electronic register effective for maintaining at least a clock time during a power outage.

Conventional electric meters employ an aluminum disk driven as a rotor of a small induction motor by an electric field at a speed proportional to the electric power being consumed by a load. Geared dials, or cyclometer discs, integrate the disk motion to indicate the total energy consumed, conventionally measured in kilowatt hours (one kilowatt hour equals one thousand watts of power consumption for one hour).

It is well accepted that the cost of electricity entails two components (1) the out-of-pocket cost (fuel, labor, etc.) for generating the electricity, and (2) the capital cost for providing the generating equipment. The out-of-pocket cost is recovered by a charge per unit of electricity consumed. The capital cost is related to the maximum load which the utility must supply. That is, synchronized peak loads from a substantial part of a utility's users can produce an instantaneous maximum load that requires a total generating capacity, representing a capital expenditure, far exceeding an average load. In order to provide a financial incentive for energy consumers to shift their power consumption from times when peak loads are known to occur to times of lower consumption, many rate-setting bodies permit utilities to charge higher rates at such peak times.

Thus, in addition to the above measurement of consumption, some electric meters contain means for separating the consumption into those parts occurring during predetermined peak and off-peak hours and for recording maximum demand during a predetermined period of time, in order to adjust billing according to such parameters. One type of electric meter is disclosed in U.S. Pat. No. 3,586,974, wherein a mechanical demand register records the power usage during a predetermined period of time and stores the value for later reading. The predetermined period of time may be, for example, the time between meter readings, or a period of time corresponding to the billing period of the utility providing the power. A clockwork mechanism restarts the mechanical demand register at the ends of regular demand intervals of, for example, a fraction of an hour, so that, at the end of the predetermined period, the stored value represents the highest value of power usage occurring during any one of the regular demand intervals in the predetermined period.

Greater flexibility is obtained using electronic acquisition, integration and processing of power usage. An electronic processor such as, for example, a microprocessor, may be employed to manage the acquisition, storage, processing and display of the usage and demand data. U.S. Pat. Nos. 4,179,654; 4,197,582; 4,229,795; 4,283,772; 4,301,508; 4,361,872 and 4,368,519, among others, illustrate the flexibility that electronic processing brings to power and energy usage measurement. Each of these electronic measurement devices includes means for producing an electronic signal having a characteristic such as, for example, a frequency or a pulse repetition rate, which is related to the rate of power usage. The electronic processor is substituted for at least part of the mechanical register of the prior art to keep track of the power usage during defined periods of time.

Various aspects of an electronic register which may benefit from the techniques of the present invention are disclosed in U.S. patent applications Ser. Nos. 599,684; 599,685; 599,736; 599,744; 599,683; 599,735; 599,743 and 599,742 all filed on Apr. 12, 1984; and Ser. Nos. 550,407 and 550,142 both filed on Nov. 10, 1983, the disclosures of which are herein incorporated by reference.

Electric meters which segregate usage and demand data according to time of use typically employ one mechanical or electronic register which accumulates the total energy usage, in addition to one or more additional registers which are active only between specific hours of the day or days of the week. More sophisticated time of use meters keep track of the day of the week, the season of the year and holidays. Such data is programmable for an extended period into the future such as, for example, 20 years. One such system, disclosed in U.S. Pat. No. 4,050,020, employs first and second clockwork registers. One of the registers is continuously active to accumulate total energy usage, while the other is enabled only at preselected times by an electronic circuit containing a built-in, or real-time, clock.

If such a real-time clock should stop for even a few relatively short periods of time, the relationship between data segregation and time of day, week, season and/or holiday would be damaged in a serious manner. As long as an electric meter receives line power, a real-time clock can be run from the line power. Line power occasionally fails, generally for relatively short periods of from a few minutes to an hour or two. It is conventional to provide a backup battery for maintaining operation of the real-time clock during such power failures.

In the prior art, a real-time clock for an electronic register employs NMOS devices. Such devices, besides consuming substantial power, require a power source capable of supplying about 5 volts DC. Since 5 VDC exceeds the voltage output of a conventional single cell, a multi-cell battery is required. In addition, due to their high power requirements, NMOS circuits need large battery capacity.

An electric meter generally has a design lifetime of at least 20 years. A battery, in contrast, reaches the end of its useful life in from about 2 to about 10 years under normal service. Battery lifetimes can be significantly shortened under adverse conditions such as, for example, an extended power outage lasting many hours or days. Rechargeable batteries, which are recharged by a built-in charger when the line power is restored, partially solve the capacity problem, but the number of charge-discharge cycles and the total life of such rechargeable batteries remain limited to less than the life of the electric meter. A rechargeable battery system for a real-time clock is disclosed in U.S. Pat. No. 4,199,717. The finite lifetime of a rechargeable battery requires that means be provided for battery replacement. The referenced patent does not contain specific disclosure for battery replacement.

Electric meters generally are built with a base mountable to a socket or terminals to sense the line voltage and current therethrough, a frame supporting and aligning the mechanical, electromechanical and electronic components, and a cover. The cover, which is generally transparent glass or plastic, provides a weather-tight and tamper-resistant enclosure for the frame and the apparatus mounted thereon. Security devices are generally used between the base and the socket, and between the cover and the base. A periodic requirement for removing the security devices, and then removing the cover for replacement of a battery, represents a significant labor burden on a utility.

The prior art, as exemplified by U.S. Pat. Nos. 4,075,561 and 4,297,635, addresses the problem of battery replacement from outside the meter cover by providing an access hatch in the cover of an electric meter for installation and removal of a battery from a unitary battery clip. Besides retaining the battery, the battery clip also makes electrical connection thereto. The disclosed battery clips do not provide for continuing battery power to critical components in the electric meter while the battery is partially withdrawn from the electric meter, or for permitting the battery to remain electrically connected to an electronic register module when the electronic register module is separated from the remainder of the electric meter.

More recent solid-state devices offer both lower power consumption and lower voltage requirements. A CMOS real-time clock circuit, for example, is capable of operation with a power consumption of about 200 microwatts at a voltage of about 2.5 volts. Thus, a 3-volt battery of modest total capacity is capable of powering a real-time clock for a period of, for example, 40 days. In addition, battery technology now offers long-life, non-rechargeable batteries such as, for example, lithium batteries, which have an improved power density and a lifetime of up to 10 years. This combination of low-power electronic circuits and long-life batteries of small size offers the ability to change the manner in which batteries are installed and replaced in electronic registers.

A favored technique for field service on an electronic register includes substitution of a known-good electronic register module for one that is apparently in a failed condition. In order to avoid zeroing the real-time clock, its parameters, and other data when the register is removed from the meter, the battery installation preferably should permit the battery to remain connected to the electronic register module when the electronic register module is separated from the remainder of the electric meter.

OBJECTS AND SUMMARY OF THE INVENTION

Accordingly, it is an object of the invention to provide a mounting technique for a battery backup installation for an electronic register module of an electric meter which overcomes the drawbacks of the prior art.

It is a further object of the invention to provide at least one mounting system for a battery backup installation which permits changing the battery from outside the meter cover without requiring removal of the meter cover.

It is a still further object of the invention to provide a mounting device for a battery backup installation in an electric meter which permits continued battery supply to an electronic register module when the electronic register module is removed from the electric meter.

It is a further object of the invention to provide means for permitting replacement of a battery connected to an electronic register module without permitting power to be cut off from the electronic register module. This objective is accomplished by providing an auxiliary battery connection which may be employed to continue battery power to the electronic register module while the main battery is being replaced.

Briefly stated, the present invention provides a battery backup installation for a time of use register for an electric meter, wherein the battery is mounted within a case of the electric meter. The case includes a hatch which permits removal and replacement of the battery without requiring removal of the case from the meter. In one embodiment, the battery is installed in a battery clip on the face plate of the meter where it is accessible through the hatch. An extra length of wire from the battery permits the battery, and its mating connectors, to be withdrawn through the hatch for replacement thereof. In a second embodiment of the invention, the battery is captured in a door of the hatch and is withdrawn from the meter by the action of opening the hatch. In this embodiment, the hatch may be hinged or not hinged. Battery replacement is facilitated while the electronic register module is separated from linesupplied power. An auxiliary battery provides an auxiliary source of backup power during battery change.

According to an embodiment of the invention, there is provided a battery installation for an electric meter, the electric meter being of a type including a cover, comprising a battery replacement hatch in the cover, means for retaining a battery within the cover in a location accessible through the battery replacement hatch, and means for permitting at least partly withdrawing the battery through the battery replacement hatch without disconnecting battery power from the electric meter.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Although the present invention may be adapted to any suitable style of electric meter which employs an element rotating at a speed proportional to power consumption, including single phase meters with one or more current windings and polyphase meters, for concreteness, the detailed description which follows is directed toward an illustrative example of a 2-wire single phase meter of the type having a single current coil and a single voltage coil.

Figure 1:
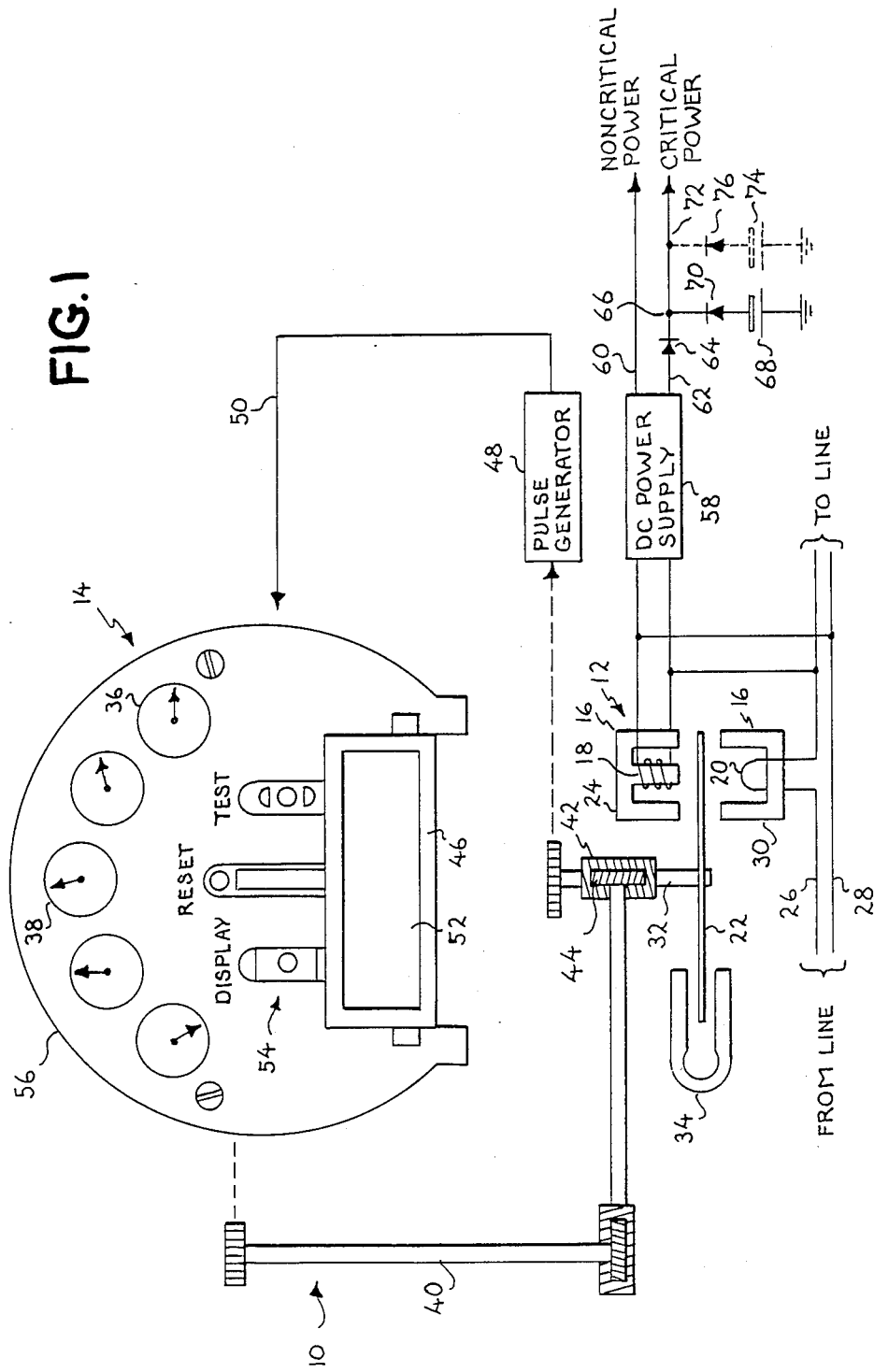
FIG. 1 is a schematic diagram of an electric meter containing an electronic register according to an embodiment of the invention.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 upon which is wound a large number of turns of fine wire. Voltage coil 18 is connected across lines 26 and 28 which feed power to a load (not shown). Current coil 20 employs a core 30 upon which a small number of turns, typically one or two, of heavy conductor are wound. Current coil 20 is connected in series with the power being fed to the load on line 26.

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force proportional to the rotational speed of disk 22. The rotational torque produced by voltage coil 18 and current coil 20, combined with the retarding torque produced by permanent magnet 34, is effective to rotate disk 22 at a speed proportional to the product of the voltage and the current; that is, the power, consumed by the load.

Register 14 includes a watthour register 36 which may include, for example, a plurality of dials 38 which are suitably geared and driven by a mechanical coupling 40 in proportion to the rotation of shaft 32. In the embodiment shown, mechanical coupling 40 includes a worm 42, which may be integrally formed in shaft 32, which engages and rotates a worm gear 44. Additional elements may be present in mechanical coupling 40 for coupling the rotation of worm gear 44 to watthour register 36 with or without change in speed and direction, according to the design of the particular electric meter 10. As is conventional, watthour register 36 totals the number of revolutions of shaft 32, suitably scaled by the gear ratios employed, for billing purposes.

An electronic register module 46 in electric meter 10 receives pulses from a pulse generator 48 on a line 50 in response to the rotation of shaft 32. Electronic register module 46 is modular in the sense that it can be inserted into, and removed from, register 14 as a unit. Electronic register module 46 includes a display 52 of any convenient type such as, for example, a liquid crystal display, for presenting billing and troubleshooting data to a user. In addition, electronic register module 46 includes a set of control switches 54 whose functions are described more fully in the referenced patent applications.

A face plate 56, preferably of sheet metal and most preferably of aluminum, covers a face of register 14, and optionally provides a surface upon which necessary indicia may be printed or otherwise included.

A DC power supply 58 is connected to line 26 and line 28 for generating DC power for electronic register module 46 as long as normal line power is available. DC power supply 58 provides power on a first line 60 to all circuits in electronic register module 46 which may be deprived of power during a power outage without adversely affecting either operation of electronic register module 46 or billing data. DC power supply 58 provides power to critical circuits on a line 62. Critical circuits are defined as those which permit the destruction of billing data, clock synchronization or calendar data during power outage. A diode 64 is connected from line 62 to a junction 66. A battery 68 is connected between ground and a terminal of a diode 70. The other terminal of diode 70 is connected to junction 66. Junction 66 is connected to a line 72 which supplies power to all critical circuits.

An optional auxiliary battery 74 and a diode 76, both shown in dashed line, may be provided for special purposes to be described.

Figure 2:
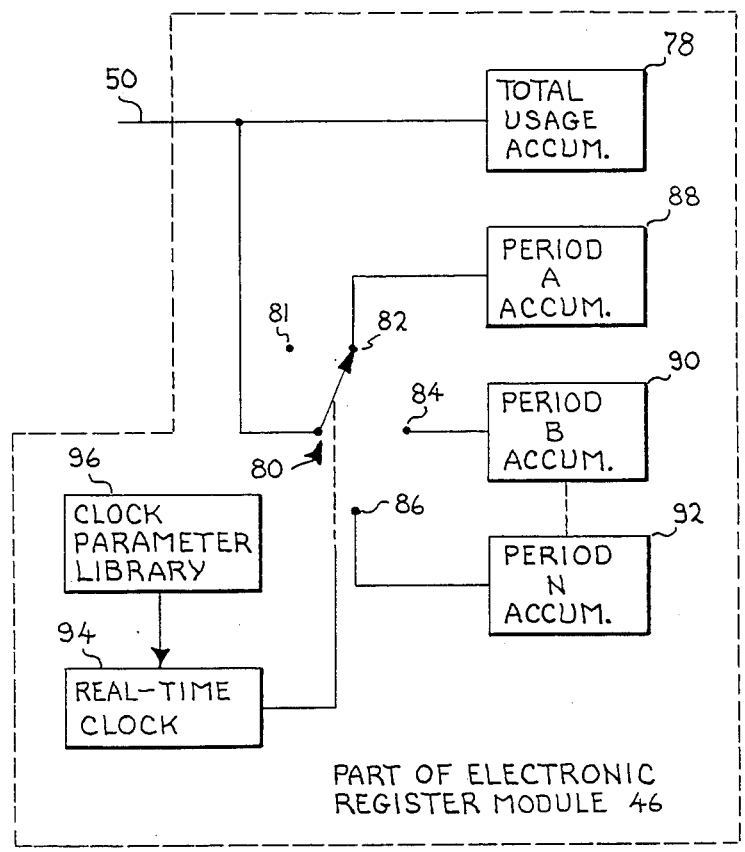
FIG. 2 is a simplified block diagram of part of an electronic register module of FIG. 1.

FIG. 2, and its description which follows, is included for an understanding of the environment in which the present invention operates.

Energy usage pulses, each representing a predetermined quantum of energy usage, are applied on line 50 to an input of a total energy usage accumulator 78. Total energy usage accumulator 78, as its name implies, totals all energy usage pulses regardless of the time or conditions of usage. Total energy usage accumulator 78 essentially duplicates the function of mechanical watthour register 36, and its inclusion in electronic register module 46 is therefore optional.

The energy usage pulses on line 50 are also connected to a switch 80 having a terminal 81 and first, second and third output terminals 82, 84 and 86, respectively. Terminal 81 is an isolated terminal without a destination. Switch 80 is connected to terminal 81 during times when specific accumulations are not required. Output terminal 82 connects energy usage pulses to a period A accumulator 88 whenever the movable element of switch 80 is connected thereto. Similarly, output terminal 84 applies the energy usage pulses to a period B accumulator 90 when the movable element of switch 80 is connected thereto. As many period accumulators as desired up to period N accumulator 92 may be provided for accumulating usage data according to any desired schedule. Additional period accumulators require the addition of a corresponding number of terminals on switch 80.

An accurate real-time clock 94 runs continuously as long as it receives sufficient power to actuate switch 80 at times predetermined by data stored in a clock parameter library 96. As the time maintained by real-time clock 94 reaches predetermined values, it actuates switch 80 to shift the usage pulses between its output terminals. For example, in accordance with data in clock parameter library 96, real-time clock 94 may actuate switch 80 to accumulate usage pulses in period A accumulator 88 during normal operating periods of non-holidays which do not fall on weekends. Period B accumulator 90 may accumulate usage pulses at peak periods which may be, for example, morning startup time at industrial plants, early winter evenings coinciding with the heaviest domestic and business lighting load, and late summer afternoons coinciding with the heaviest air conditioning load. The utility may wish to encourage energy usage at times of minimum system load at which its marginal costs for generating power is lowest. At such times, real-time clock 94 may actuate switch 80 to accumulate usage pulses in period N accumulator 92.

The accumulated usage data from total energy usage accumulator 78, period A accumulator 88, period B accumulator 90 and period N accumulator 92 is read out in a conventional manner using, for example, display of data on display 52 (FIG. 1) or by automatic data readout using electrical, optical, or other means (not shown).

It would be clear to one skilled in the art that loss of data in total energy usage accumulator 78, period A accumulator 88, period B accumulator 90, and period N accumulator 92 would have a serious effect on revenue. These elements are thus included within the definition of critical circuits requiring the availability of battery power or other means of permitting the data to survive a power outage. The data in clock parameter library 96 determines the times at which transition between the several accumulators takes place. Loss of this data effectively renders electronic register module 46 inoperative until it is reprogrammed. In addition, clock parameter library 96 may include a substantial amount of installation-specific items whose loss would entail a substantial effort to replace. For these reasons, clock parameter library 96 is included within the definition of critical circuits. If real-time clock 94 loses synchronism with real time, then transitions between accumulators cannot take place at the predetermined times. Thus, not only must power be maintained to real-time clock 94, but also it must continue to keep accurate time, unaffected by the occurrence of a power outage.

Figure 3:
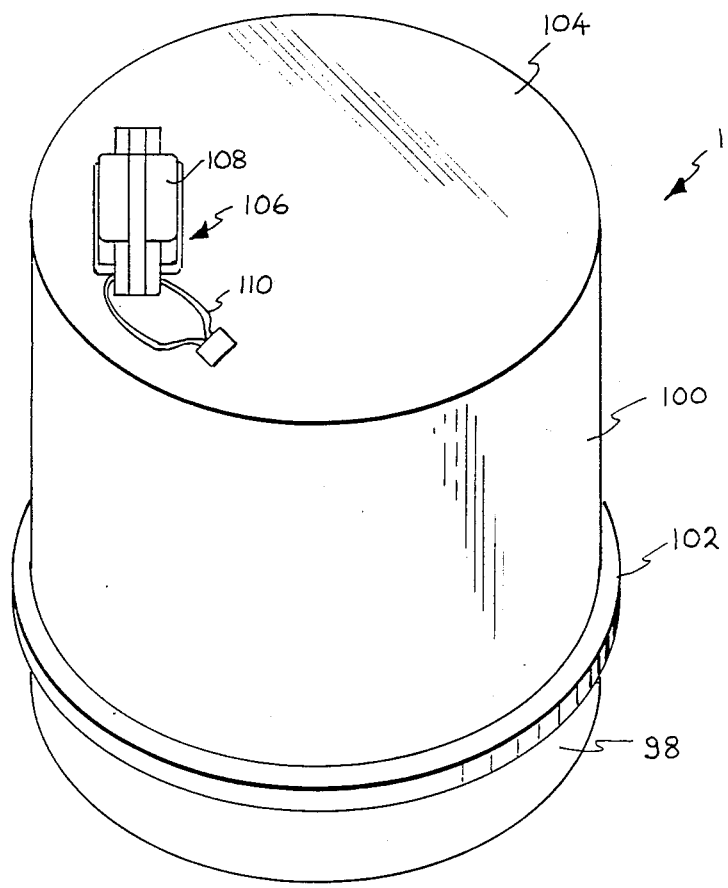
FIG. 3 is a perspective view of an electric meter suitable for containing the present invention.

Referring now to FIG. 3, electric meter 10 includes a base 98 to which a transparent cover 100 is affixed by a mounting ring 102. Mounting ring 102 is frequently equipped with a security seal to discourage tampering with electric meter 10, and to give evidence of such activity when such tampering occurs. In addition, base 98 is conventionally affixed to a socket (not shown) which may also include a security seal. Frequently, the socket security seal also covers mounting ring 102. In such an installation, gaining access to the interior of transparent cover 100 requires removal of two security seals before transparent cover 100 is removed from base 98. Replacement of a backup battery mounted in the interior of transparent cover 100 is complicated by such construction.

An end face 104 of transparent cover 100 includes a battery replacement hatch 106 through which a backup battery may be removed and replaced. Battery replacement hatch 106 includes a hatch door 108 which may include means for attaching a security seal 110 of the wire or band type.

Figure 5:
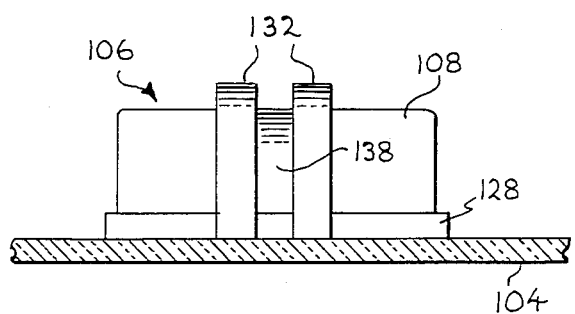
FIG. 5 is a view taken along V—V in FIG. 4.
Figure 4:
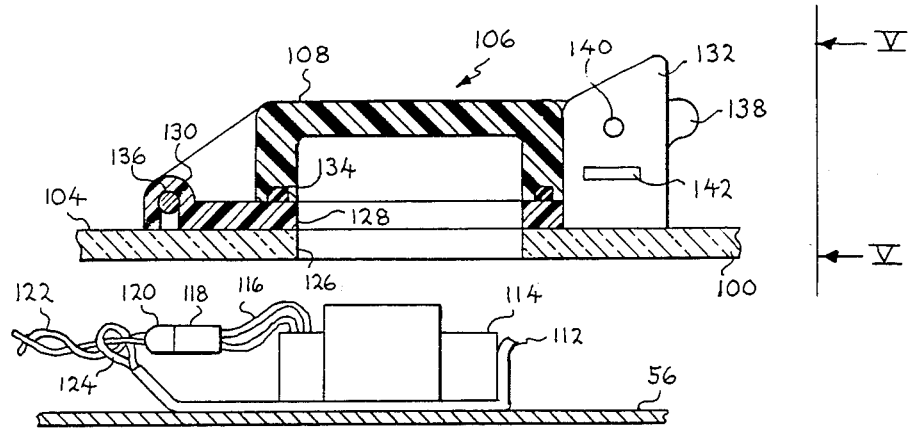
FIG. 4 is a cross section showing a battery replacement hatch and a battery installation according to an embodiment of the invention.

Referring now to FIGS. 4 and 5, face plate 56 includes a battery clip 112 affixed thereto. A battery 114, preferably of a type having an insulated casing, is clipped into battery clip 112. Power from battery 114 is connected through a pair of wires 116 to a polarized connector 118. A mating polarized connector 120 is connected to a pair of wires 122 which supply battery power to electronic register module 46 (FIG. 1). A split ring 124, disposed downstream of polarized connector 118 and mating polarized connector 120, helps support wires 122 and has an opening smaller than a cross-sectional dimension of mating polarized connector 120, thereby preventing mating polarized connector 120 from being pulled so far that it disengages from polarized connector 118. Since it is split, however, wires 122 can be easily disengaged from split ring 124, when necessary.

An opening 126 in end face 104 is aligned above battery 114 and includes an area sufficient for withdrawing and inserting battery 114 therethrough. A base member 128 of battery replacement hatch 106 is sealed to end face 104 about the perimeter of opening 126. If end face 104 is made of a polycarbonate resin, then it is convenient to make base member 128 also of the same material, and to seal base member 128 to end face 104 by thermal means such as, for example, ultrasonic bonding.

Base member 128 includes two hinge loops 130 and two latch halves 132 integrally formed therewith.

Hatch door 108 includes a compressible seal 134 in sealing abutment with base member 128 for sealing the interior of transparent cover 100 against entry of contaminants or moisture through opening 126. Hatch door 108 includes a hinge pin 136 which is captured under hinge loops 130 when base member 128 is affixed to end face 104. In addition, hatch door 108 includes a latch knife 138 fittable between first and second latch halves 132. A seal hole 140 and a seal slot 142 pass through latch halves 132 and latch knife 138 for attachment of a conventional security seal (not shown).

In operation, when it is desired to replace battery 114, hatch door 108 is opened and battery 114 is unclipped from battery clip 112. A substantial extra length of wires 122 is provided to serve as a service loop allowing battery 114, polarized connector 118 and mating polarized connector 120 to be withdrawn through base member 128. Once outside opening 126, polarized connector 118 and mating polarized connector 120 may be disconnected, and a polarized connector 118 of a replacement battery 114 may be mated with mating polarized connector 120. Then, the replacement battery 114 may be clipped into battery clip 112. As battery 114 is inserted through opening 126 and placed in its final location, the extra length of wires 122 passes through split ring 124. When battery replacement is completed, hatch door 108 is closed over opening 126 and may optionally be sealed in place using a seal threaded through seal hole 140 or seal slot 142.

As long as battery replacement is performed while power continues to be supplied from lines 26 and 28, disconnection of polarized connector 118 and mating polarized connector 120 does not interrupt the supply of power to electronic register module 46, and thus poses no problem of lost data.

It is frequently desirable to permit battery 114 to remain connected to electronic register module 46 when electronic register module 46 is removed from register 14 for test or service. The embodiment of the invention shown permits removal of battery 114 from battery clip 112 and, when wires 122 are disengaged from split ring 124, electronic register module 46 can be separated from the remainder of register 14 while permitting battery 114 to remain attached thereto and continuing to provide backup power thereto. Among other desirable effects, the ability to permit battery 114 to remain attached to electronic register module 46 while electronic register module is removed from register 14, permits replacing the remainder of register 14 without losing data from electronic register module 46.

Referring again momentarily to FIG. 1, if it is desired to replace battery 68 while electronic register module 46 is removed from register 14, that is, when the only source of power is battery 68, the resulting loss of power would cause data loss and lost synchronization in critical circuits. In order to prevent such loss of data and synchronization, auxiliary battery 74 may be connected in parallel with battery 68 through diode 76 before battery 68 is disconnected. When a replacement battery 68 is installed, auxiliary battery 74 may be removed if desired.

Since auxiliary battery 74 is primarily used as a temporary power source during the replacement of battery 68, it is not necessary to provide a permanent location for auxiliary battery 74 within electric meter 10. Should it be desirable to mount auxiliary battery 74 therein, however, the position where auxiliary battery 74 is mounted is immaterial to the invention.

Figure 6:
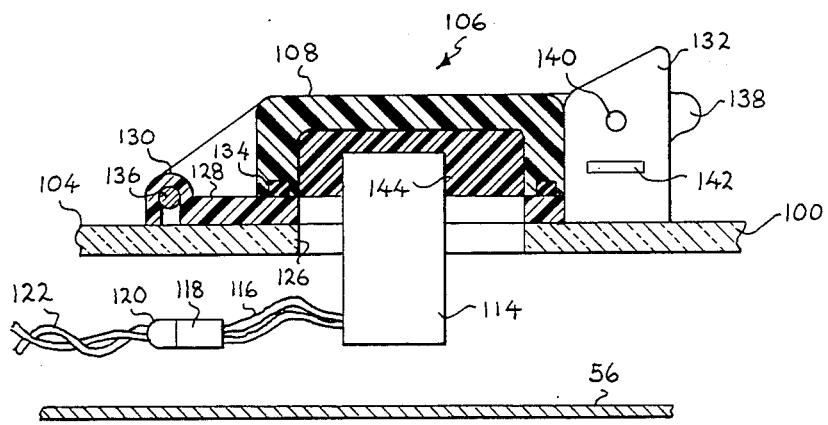
FIG. 6 is a cross section showing a battery installation according to a further embodiment of the invention.

Referring now to FIG. 6, an embodiment of the invention is shown wherein battery 114 is relocated from the face of face plate 56 to a mounting location within hatch door 108. A battery retainer 144 clamps battery 114 within hatch door 108 whereby, when hatch door 108 is opened, battery 114 is moved through opening 126. This simplifies the task of grasping battery 114 since it does not require removing it from a clip within transparent cover 100. Wires 122 requires an extra length to serve as a service loop permitting battery 114, polarized connector 118 and mating polarized connector 120 to be moved outside opening 126.

Battery retainer 144 may be of any convenient type including a resilient mass, as shown, which is capable of retaining battery 114 by friction. Other types of devices may be substituted for the resilient mass in battery retainer 144 without departing from the spirit and scope of the invention. For example, a part-turn fastener may be formed cooperatively between an interior of hatch door 108 and an exterior of battery 114. The part-turn fastener is effective for securing battery 114 in the position shown and permits easy removal when battery 114 is moved outside opening 126.

An embodiment of hatch door 108 may be employed which does not swivel on a hinge pin. Instead, hatch door 108 may be removed by displacement whereby battery 114 is drawn straight through opening 126. This embodiment is used where the size and/or length of battery 114 is too great to permit it to pass through opening 126 on a swivelled hatch door 108.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A battery installation for an electric meter, said electric meter including a cover, comprising:
    a battery replacement hatch in said cover;
    means for retaining a battery within said cover in a location accessible through said battery replacement hatch;
    means for permitting at least partly withdrawing said battery through said battery replacement hatch without disconnecting battery power from said electric meter;
    said electric meter including an electronic register module which is removable from a remainder of said electric meter;
    said electronic register module containing volatile memory elements whose contents would be lost in the event that electric power is not maintained to said electronic register module; and
    said means for permitting at least partly withdrawing includes means for permitting said battery to remain connected to said electronic register module when said electronic register module is removed from said remainder of said electric meter, whereby said electric power is maintained to prevent loss of data in said volatile memory elements when said electronic register module is removed from said electric meter.

2. A battery installation according to claim 1 wherein said electric meter is of a type having a face plate spaced from said cover, and said means for retaining a battery includes a battery clip affixed to said face plate.

3. A battery installation according to claim 2 wherein said means for permitting includes at least first and second wires connected between said battery and a remainder of said electric meter, and said first and second wires include sufficient length to permit said withdrawing.

4. A battery installation according to claim 3 wherein said means for permitting includes first and second mating connectors in said wires, said first and second connectors being sized to pass through said battery replacement hatch when said battery is at least partly withdrawn through said battery replacement hatch.

5. A battery installation according to claim 4 further comprising means for preventing strain on said first and second connectors from accidentally producing disconnection thereof.

6. A battery installation according to claim 5 wherein said means for preventing strain includes a split ring encircling said first and second wires downstream of said first and second connectors, said split ring being of a size insufficient to permit said first and second connectors from passing therethrough.

7. A battery installation according to claim 1 wherein said battery replacement hatch includes a hatch door, said hatch door being movable from said cover, and said means for retaining a battery includes means for mounting said battery within said hatch door whereby, when said hatch door is moved with respect to said cover, said battery is at least partly removed from an interior of said cover.

8. A battery installation according to claim 1 further comprising means for connecting an auxiliary battery to said electric meter in addition to the first-mentioned battery, whereby said first-mentioned battery may be disconnected and replaced without permitting battery power to be withdrawn from said electric meter.

* * * * *